US010725083B2

(12) United States Patent
Zanette et al.

(10) Patent No.: US 10,725,083 B2
(45) Date of Patent: Jul. 28, 2020

(54) STIRRED SOURCE AND METHOD OF RFI TESTING

(71) Applicant: MPB Technologies Inc., Pointe-Claire (CA)

(72) Inventors: Daniele Zanette, Richmond (CA); Eric J Jackson, Edwards (CA)

(73) Assignee: MPB TECHNOLOGIES INC., Pointe-Claire (CA)

( * ) Notice: Subject to any disclaimer, the term of this patent is extended or adjusted under 35 U.S.C. 154(b) by 0 days.

(21) Appl. No.: 16/034,537

(22) Filed: Jul. 13, 2018

(65) Prior Publication Data
US 2019/0025361 A1    Jan. 24, 2019

Related U.S. Application Data

(60) Provisional application No. 62/535,655, filed on Jul. 21, 2017.

(30) Foreign Application Priority Data

Jul. 21, 2017  (CA) ...................................... 2974054

(51) Int. Cl.
G01R 31/00 (2006.01)
G01R 29/08 (2006.01)
(52) U.S. Cl.
CPC ......... G01R 31/002 (2013.01); G01R 31/001 (2013.01); G01R 31/008 (2013.01); G01R 29/0814 (2013.01)
(58) Field of Classification Search
CPC .. G01R 31/001; G01R 31/002; G01R 31/008; G01R 35/0821; H04B 17/20; H04B 17/29
See application file for complete search history.

(56) References Cited

U.S. PATENT DOCUMENTS 3,806,943 A    4/1974  Holloway
4,743,887 A *  5/1988  Pothier .............. G01R 31/2822
                                                    324/510
(Continued)

FOREIGN PATENT DOCUMENTS

CN    102830289 A    12/2012
CN    102841263 A    12/2012
(Continued)

OTHER PUBLICATIONS

Beer, Stefan, and Thomas Zwick. "Probe based radiation pattern measurements for highly integrated millimeter-wave antennas." Antennas and Propagation (EuCAP), 2010 Proceedings of the Fourth European Conference on. IEEE, 2010.
(Continued)

*Primary Examiner* — Huy Q Phan
*Assistant Examiner* — Dustin R Dickinson
(74) *Attorney, Agent, or Firm* — Anglehart et al.

(57) ABSTRACT

A radiofrequency (RF) source for use in testing radiofrequency interference (RFI) stresses has an RF transmitter emitting an electromagnetic field corresponding to at least one frequency, power, and state-of-polarization (SOP). Drives rotate the transmitter to emit, in a temporally continuous fashion, RF power and RF state of polarization from the RF transmitter in, respectively, every direction and every SOP orientation within an RF reflective structure in order to effectively characterize RFI stresses on said equipment to be tested.

15 Claims, 5 Drawing Sheets

(56) References Cited

U.S. PATENT DOCUMENTS

| | | |
|---|---|---|
| 5,786,680 A | 7/1998 | Klikier et al. |
| 5,923,174 A | 7/1999 | Darling, Jr. |
| 6,181,285 B1 | 1/2001 | Sullivan et al. |
| 6,556,023 B2 | 4/2003 | Okazaki |
| 7,791,355 B1 | 9/2010 | Esher et al. |
| 8,400,366 B2 | 3/2013 | Kitada |
| 8,436,777 B2 | 5/2013 | Ito et al. |
| 8,467,756 B2 | 6/2013 | Ozaki et al. |
| 8,786,502 B2 | 7/2014 | Ho |
| 8,971,821 B2 | 3/2015 | Schlub et al. |
| 9,377,495 B2 | 6/2016 | Chien et al. |
| 2001/0052779 A1 | 12/2001 | Okazaki |
| 2003/0184417 A1 | 10/2003 | Li et al. |
| 2004/0183529 A1 | 9/2004 | Kajiwara et al. |
| 2006/0017630 A1 | 1/2006 | Kildal |
| 2007/0103366 A1* | 5/2007 | Park ............ G01S 3/42 342/359 |
| 2008/0002201 A1* | 1/2008 | Morita ............ G01J 4/04 356/364 |
| 2009/0140750 A1* | 6/2009 | Sugiura ............ G01R 29/0821 324/627 |
| 2009/0303141 A1 | 12/2009 | Kosdikian et al. |
| 2011/0230143 A1* | 9/2011 | Lundstrom ........ H04W 24/06 455/67.11 |
| 2012/0100813 A1* | 4/2012 | Mow ............ H04B 17/12 455/67.12 |
| 2013/0171945 A1 | 7/2013 | Yang |
| 2014/0087668 A1* | 3/2014 | Mow ............ H04B 17/318 455/67.14 |
| 2015/0084623 A1 | 3/2015 | Hwang et al. |
| 2016/0018451 A1* | 1/2016 | Heumphreus ........ H01Q 17/00 324/628 |
| 2016/0301130 A1* | 10/2016 | Nazario-Romero .... G01S 13/78 |

FOREIGN PATENT DOCUMENTS

| | | |
|---|---|---|
| DE | 4342107 A1 | 6/1995 |
| DE | 102011082008 A1 | 3/2013 |
| JP | 11-97919 A | 4/1999 |
| WO | WO 2017/032209 A1 | 3/2017 |

OTHER PUBLICATIONS

CA2974054 office action dated Oct. 12, 2017.
Zwick, Thomas, et al. "Probe based MMW antenna measurement setup." Antennas and Propagation Society International Symposium, 2004. IEEE. vol. 1. IEEE, 2004.

* cited by examiner

STIRRED SOURCE AND METHOD OF RFI TESTING

This application is a nonprovisional of U.S. provisional patent application 62/535,655 filed Jul. 21, 2017, and this application claims priority from patent application in Canada No. 2,974,054 filed Jul. 21, 2017, the specification contents of which are are hereby incorporated by reference.

TECHNICAL FIELD

The present application relates to the field of electromagnetic interference (EMI) or radio-frequency interference (RFI) testing.

BACKGROUND

RFI testing can be broken down into two categories, the testing of how electronic equipment is susceptible to external RF sources, and the testing of the RF noise emitted by electronic equipment during its operation. For the latter, testing can comprise placing the equipment in an anechoic chamber and detecting RF using a receiving antenna at different positions and orientations with respect to the equipment. This allows the emissions to be characterized. For the former, susceptibility to RF interference typically depends on the orientation of the RF field as well as the frequency. Such testing can comprise using an RF reflective chamber, called a reverberation chamber, and varying the amplitude and phase of the RF field. The most common way to create such variation is to place a stirrer within the reverberation chamber. The stirrer is a large metal "paddle" or undulated metal sheet that is rotated to cause the RF energy to be reflected into a variety of different modes within the chamber. When a stirrer is not used, a source can be positioned differently to create different modes within the chamber. This is typically done by placing the RF source in a first position, taking measurements or testing performance of the electronic device, and then repeating with different RF source positions or orientations.

In the case of aircraft, the fuselage is often made of aluminum and creates an RF reflective chamber. RF emitters, such as WiFi and mobile telephone transmitters, can result, in particular when a large number are involved, in significant RF power being generated within the chamber of the fuselage. Testing of the impact of such RF power on cockpit equipment is known in the art.

When testing susceptibility, it is desirable to provide RF power for each frequency, with each orientation, with each polarization, and at consistent power. Practically, this is difficult to achieve. Physically moving a source to assume every orientation and polarization around equipment to be tested in an anechoic chamber is onerous. In the case of an aircraft where testing of installed cockpit equipment is to be done, moving the source around the equipment to be tested is not possible. Ensuring that each orientation and polarization of the RF source will impinge on the equipment to be tested in a chamber not having a stirring paddle is a challenge.

In US patent pre-grant publication 2009/030141 (published on 10 Dec. 2009, naming assignee EADS France), a reverberation chamber is disclosed that has an RF transmitter whose azimuth and elevation are controlled by motorized drives. As described in this reference, the aim of the reverberation chamber system is not to provide for electromagnetic excitation distributed in every direction with the same power but rather, at the position of the object 12, to foresee stresses applied this object 12 along the greatest possible variety of angles of incidence, (preferably an exhaustive range of angles of incidence and with significant power) and good statistics less dependent on the characteristics of the chamber. The disclosed embodiments, by causing the source to rotate and the stirrer to rotate about the source, creates a stirring that is simultaneously mechanical and positional. However, with the disclosed embodiments, ensuring that the equipment to be tested receives RF power at every angle of incidence and at every polarization requires either a stirring device and/or special control over the geometry of the test system.

SUMMARY

Applicant has found that an RF source having a first degree of freedom of motion to direct RF power in every direction within a reverberation chamber or an RF reflective structure can be combined with a polarization rotation degree of freedom to direct RF power in every direction with every polarization required to effectively test RFI stresses on equipment to be tested. Preferably, this RF source is used without using any stirrer within the chamber or structure.

In some embodiments, the RF source is mounted using a first bearing to rotate about its own first axis for polarization rotation, with this first bearing being mounted to a second bearing to rotate about a second axis having an angle with respect to the first axis of the source. With the rates of rotation being controlled at the first and second axes, RF power is provided in every direction with every polarization required to effectively test RFI stresses on equipment to be tested.

Applicant has also found that such an RF source can be used to reliably test cockpit equipment in an aircraft having an aluminum fuselage by placing the source in a passenger cabin to illuminate the cabin and cockpit with RF power.

In some embodiments, a radiofrequency (RF) source for use in testing radiofrequency interference (RFI) stresses has an RF transmitter emitting an electromagnetic field corresponding to at least one frequency, power, and state-of-polarization (SOP). Drives rotate the transmitter to emit, in a temporally continuous fashion, RF power and RF state of polarization from the RF transmitter in, respectively, every direction and every SOP orientation within an RF reflective structure in order to effectively characterize RFI stresses on said equipment to be tested.

In some embodiments, there is provided a radiofrequency (RF) source for use in testing radiofrequency interference (RFI) stresses on equipment to be tested, the source comprising a base; a first rotational joint having a first axis of rotation connected to the base and supporting a second rotational joint having a second axis of rotation at an angle with respect to the first axis; an RF transmitter, emitting an electromagnetic field corresponding to at least one frequency, power, and state-of-polarization (SOP), mounted to the second rotational joint for rotation about the second axis; a first drive for causing rotation of the first rotational joint; a second drive for causing rotation of the second rotational joint at a rotational speed different from the first drive; wherein the first drive and the second drive cooperate, in use, to emit, in a temporally continuous fashion, RF power and RF state of polarization from the RF transmitter in, respectively, every direction and every SOP orientation within an RF reflective structure in order to effectively characterize RFI stresses on the equipment to be tested.

In some embodiments, every SOP orientation can be every linearly-polarized SOP orientation. In some embodiments, every SOP orientation can be every elliptical SOP orientation, also encompassing all linear and circular SOPs.

In some embodiments, an adjustment mechanism can be provided for adjusting the angle between the first rotational joint and the second rotational joint.

In some embodiments, the base can comprise an adjustable mounting having a plurality of degrees of freedom for adjusting a spatial orientation of the first rotational joint.

In some embodiments, the first drive and the second can share a common motor and have a flexible linkage interconnecting them.

In some embodiments, the common motor can be associated with the first drive, and the flexible linkage comprise a drive cable actuated by rotation of the first rotational joint.

In some embodiments, the first drive can comprise a belt or chain drive.

In some embodiments, the second drive can comprise a belt or chain drive.

In some embodiments, there is provided in combination, the source as defined above and a reverberation chamber.

In some embodiments, there is provided in combination, the source as defined above and an aircraft having a fuselage for receiving the source and having an RF reflective structure for redirecting electromagnetic waves from the source to the equipment to be tested mounted to the fuselage.

In some embodiments, there is provided a method of testing radiofrequency interference (RFI) stresses on equipment to be tested in an aircraft having a fuselage structure that reflects RF waves, the method comprising: providing a radiofrequency (RF) source as described above; positioning the source in a cabin of the fuselage; selecting the angle between the first rotational joint and the second rotational joint for suitable coverage of both the direction and state of polarization (SOP) of RF waves directed towards the equipment and resulting from reflections by walls of the fuselage; operating the first drive and the second drive while providing an RF signal to the RF transmitter of the source to direct RF waves in every direction with every state of polarization required to effectively characterize RFI stresses on the equipment to be tested; and detecting any malfunction or abnormal function of the equipment under the RFI stresses.

In some embodiments, there is provided a method of testing radiofrequency interference (RFI) stresses on equipment to be tested in an aircraft having a fuselage structure that reflects RF waves, the method comprising: providing a radiofrequency (RF) source having a base for supporting the source; positioning the source in a cabin of the fuselage; selecting an angle between a first rotational joint, having a substantially horizontal axis of rotation, connected between the base and the source for suitable coverage of both the direction and state of polarization (SOP) of RF waves directed towards the equipment and resulting from reflections by walls of the fuselage; operating the first drive while providing an RF signal to the RF transmitter of the source to direct RF waves in every direction required to effectively characterize RFI stresses on the equipment to be tested; and detecting any malfunction or abnormal function of the equipment under the RFI stresses. In some embodiments, the SOP can be circularly polarization.

BRIEF DESCRIPTION OF THE DRAWINGS

The invention will be better understood by way of the following detailed description of embodiments of the invention with reference to the appended drawings, in which.

DETAILED DESCRIPTION

Figure 1A:
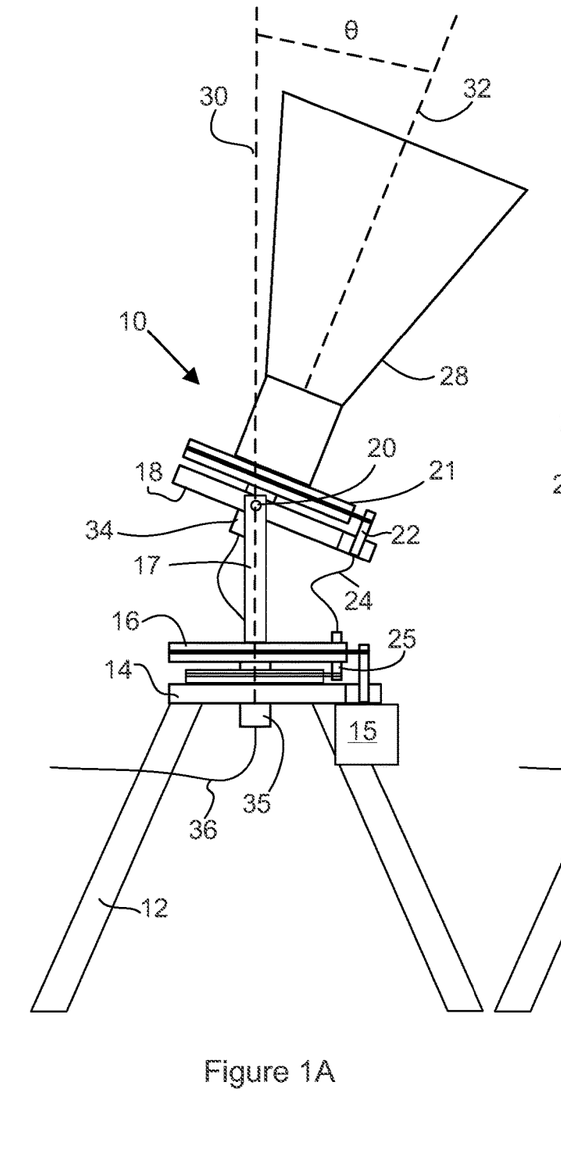
FIG. 1A is a side view of an RF source according to one embodiment in which the source antenna is mounted using two rotation joints with a drive mechanism driving a first rotation joint with the second rotation joint being driven dependently from the rotation at the first joint, the source being shown in a first rotational position.
Figure 1B:
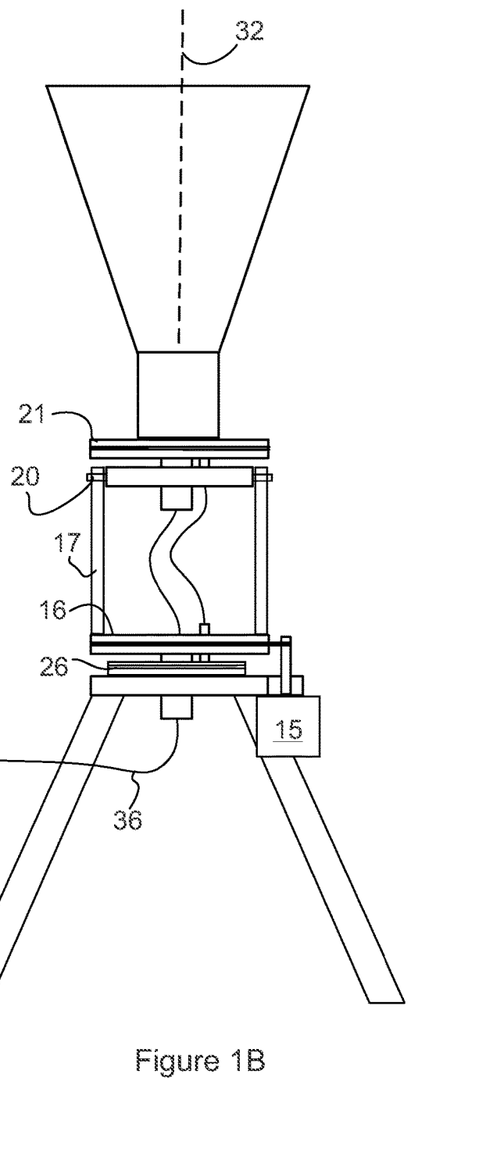
FIG. 1B is a side view of an RF source according to one embodiment in which the source antenna is mounted using two rotation joints with a drive mechanism driving a first rotation joint with the second rotation joint being driven dependently from the rotation at the first joint, the source being shown in a second rotational position about the first joint about 90 degrees away from the first rotational position.

As illustrated in FIG. 1A, the source 10 comprises a base 12. The base can be fixed in position and orientation, or in some embodiments, it can be configured to provide an adjustable position and/or orientation. The base 12 supports a mounting or a platform 14 for supporting a first rotational joint 16 driven by a motor 15. In the embodiment shown, the motor 15 drives a chain drive gear so that a belt or chain drives a wheel of the joint 16 to rotate. The speed of rotation of the first joint can be for example between about 0.5 to about 5 RPM. In the embodiment shown, two arms 17 are mounted to the wheel base 16 and support at their upper ends a platform 18. The platform 18 is connected to the arms 17 using an adjustable joint 20 that allows an angle theta to be set. The adjustable joint 20 is illustrated schematically as a simple pin, but is to be understood to comprise an adjustment mechanism such as a clutch/brake mechanism or a worm gear and worm wheel to allow for the angle theta to be set as desired. It will be appreciated that this joint 20 can be also fixed in an angular position, and alternatively it can be adjustable without providing a rotational joint.

The platform 18 supports a second rotational joint 21 that also comprises a wheel that is belt or chain driven by a pulley or sprocket 22. In this embodiment, the sprocket 22 is driven by a rotary drive cable 24 that is connected to a sprocket or pulley 25 that is in turn driven by a fixed wheel 26 and a belt or chain as shown. The second rotational joint 21 supports a source transmitter and antenna 28 that emits RF power with a fixed linear polarization. The antenna 28 can comprise a dual ridge horn and can have a square-base pyramid structure for guiding the RF fields. Other types of polarized antennas 28 can be used. The gear ratios are chosen so that as the source 28 rotates about axis 30 and axis 32, the polarization of the RF illumination changes for each angular position about axis 30.

While a chain or belt drive system is illustrated, it will be appreciated that a variety of drive systems can be used, such as worm drives, direct gear drives, piezoelectric motors, etc.

In the embodiment illustrated, the RF source signal is received through an RF slip ring 34 at the second joint 21 and then through a slip ring 32 at the first joint 16 and then through RF transmission cable 36. It will be appreciated that the RF signal generation could be provided on platform 16 or platform 18 such that fewer or no RF slip rings would be required, while only power supply power would need to be provided to the RF signal generator.

Figure 2:
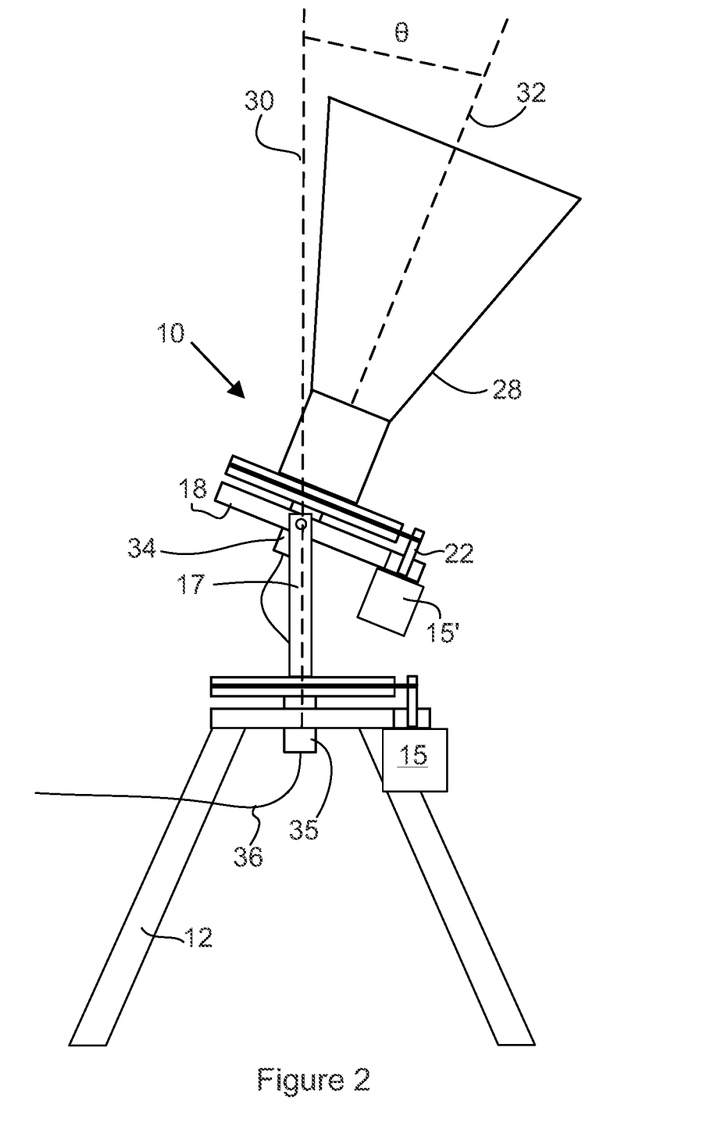
FIG. 2 is a side view of an RF source according to another embodiment in which the source antenna is mounted using two rotation joints with a drive mechanism driving a first rotation joint and a second drive mechanism driving the second rotation joint.

In the embodiment of FIG. 2, two motorized drives 15 and 15' are provided. Motor 15' drives sprocket 22 directly. The desired ratio between the rotational speeds about axes 30 and 32 is then controlled using suitable motor controllers.

While not illustrated in the embodiments of FIGS. 1A and 2, it will be appreciated that either counterweights or a repositioning of the rotational joints can be used to have the axis of rotation located closer to the center of mass of the object that is rotating. This can reduce the power requirement of the motor.

Figure 3:
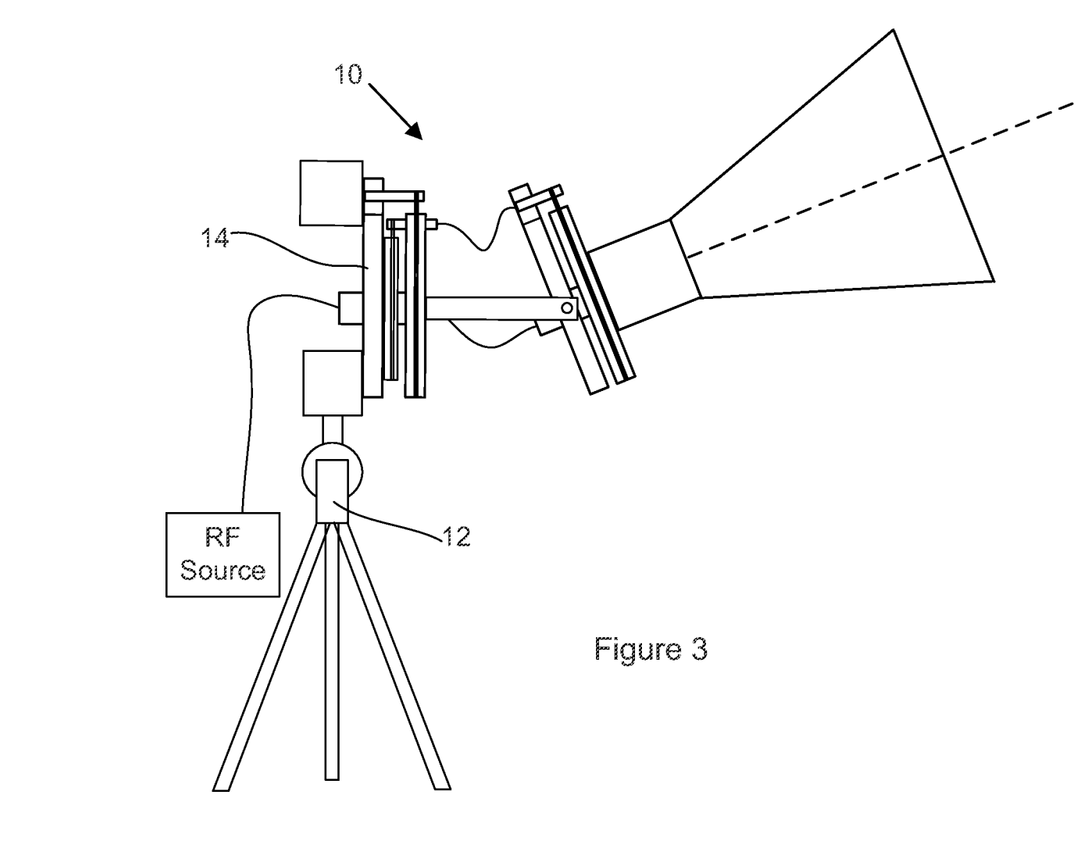
FIG. 3 is a side view of an RF source according to another embodiment in which the source antenna according to the embodiment of FIG. 1A is mounted to a tripod mounting that allows the first rotational joint to be positioned and oriented as desired.

FIG. 3 illustrates the source of FIG. 1A mounted to a stand 12 that offers adjustability of the position and orientation of the platform 14. Such a stand can be manually adjustable or it can be adjustable using motorized drives. Applicant has found that manually adjusting the source 10 using a robust camera tripod mount is a satisfactory example of a suitable stand 12.

The antenna rotator 10 is designed to send out electric fields into a space so that in two rotations of the main carrier every position seen by the dual ridge horn antenna will have sent out two fields at 90 degrees to one another. Also settable is angle theta at which the rotational axis angle of horn antenna can be aimed relative to that of the rotational axis angle of the main carrier 14. The horn antenna 28 is mounted on a secondary carrier 18 in a manner that allows the antenna to rotate about its transmission axis. This carrier is in turn mounted to the main carrier that rotates about an axis perpendicular to the back plate of the machine. The secondary carrier can have its rotational angle theta set from 0 degrees to 60 degrees from that of the main carrier. As an example, if the antenna carrier has the angle of its rotational axis angle set at 0 degrees it would be in line with the rotational axis of the main carrier. The antenna would rotate on its transmission axis and the resulting rotating transmitted signal would rotate on the axis of main carrier.

A sprocket mounted to main carrier is connected to a sprocket that is mounted in a stationary manner to the back plate of the machine. This stationary sprocket is centered on the rotational axis of the main carrier. This means that as the main carrier rotates, the sprocket mounted to the main carrier also rotates and drives a flexible drive cable that in turn drives a sprocket mounted to the secondary carrier. This sprocket drives a sprocket mounted to the antenna resulting in the antenna's rotation. Ratios of these sprockets are chosen so that on a second rotation of the main carrier, the antenna's field is at 90 degrees to its position on the first rotation. The main carrier is driven by a variable-speed motor. As a result, the operators have complete control of the transmitted field in that they can control the direction the machine is aimed, the rotational speed of the machine, and the off-axis angle of the antenna while always getting 90 degree fields.

Figure 4:
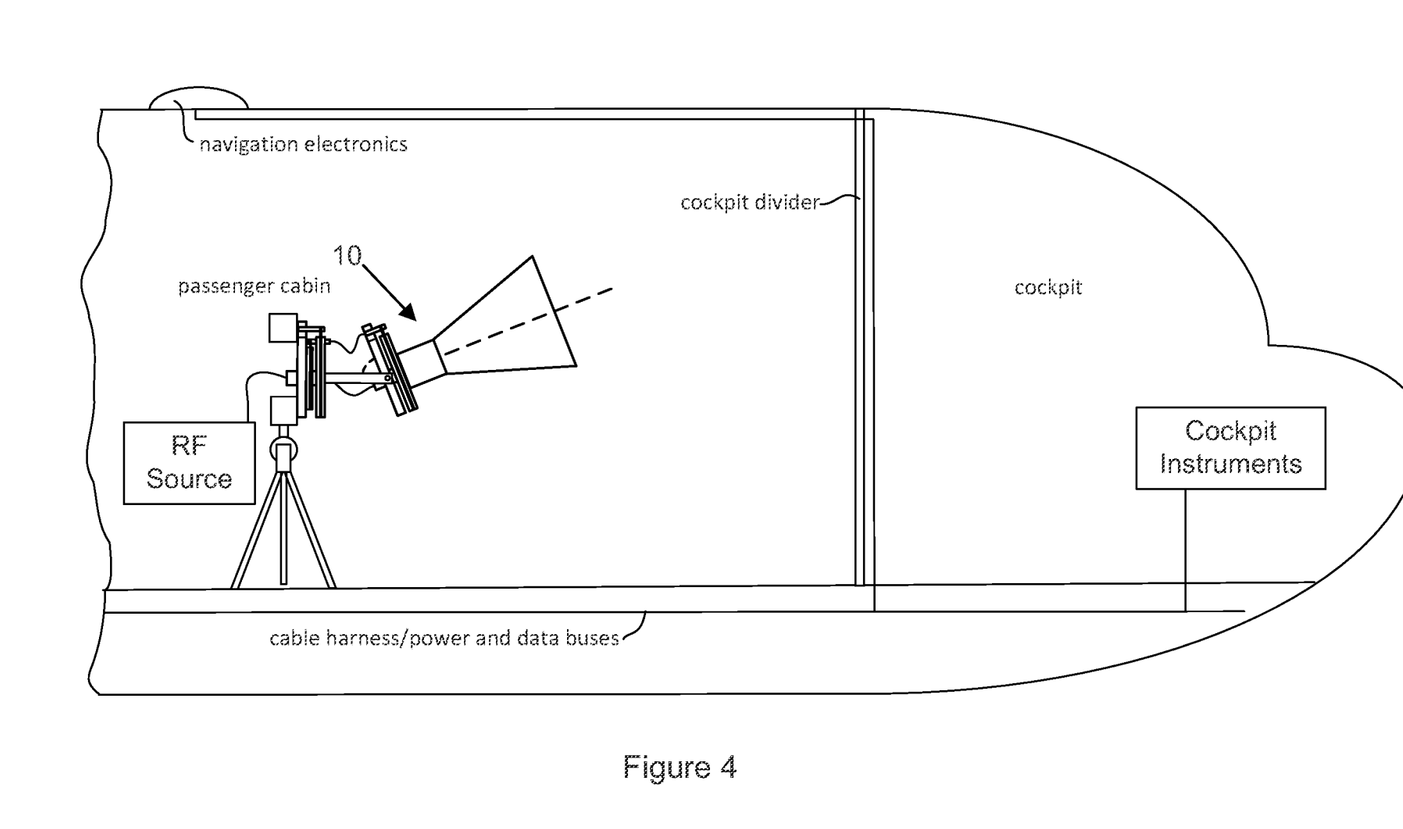
FIG. 4 is a side sectional schematic view of an aircraft in which the embodiment of FIG. 3 is located for illuminating an aircraft fuselage with RF power for testing of on-board electronics.

In the embodiment of FIG. 4, the source 10 is used in an aircraft fuselage for RFI testing of equipment found in or on the aircraft, for example navigation electronics, cockpit instrumentation, cabling, entertainment systems, smoke detectors, galley equipment, etc. The source 10 can be arranged at one or more suitable locations within the passenger cabin (or more generally within the fuselage), typically in an aisle at a height level with or just above the seat backs. The source 10 can be directed "fore" towards the cockpit or aft towards the tail of the aircraft. The RF power is mostly reflected from the body of the fuselage, however, a fuselage is not a perfect reverberation chamber and power is lost to portals and attenuation/multiple reflections due to objects within the fuselage.

Applicant has found that source 10 powered with about 50 watts of RF power and set with an angle theta between 10 and 40 degrees. The distance between the source 10 and the cockpit, when testing cockpit equipment, and also the suitable height and choice of theta depend on the aircraft geometry. Sensors can be used to measure the RF signal when first testing an aircraft to ensure that adequate power is reaching each location within the aircraft, however, once a suitable source location is determined for an aircraft design, such calibration measurements using sensors can be omitted.

The RF power required can be dependent on the antenna used, the size of the aircraft and the number of passengers. For example, a dipole with 2 dB of gain will require 4 times the RF power of a DRG horn antenna with 8 dB gain. Also, an aircraft such as a Global 5000 carrying 16 passengers will require less power than a Dash 8 Q400 with 70 passengers, all prescribed by the test standard. One may have a full 400 passenger 747 or a 747 Combi carrying 150 passengers. The angle theta ensures that the operator of the source is sufficiently painting (illuminating) the interior fuselage with RF waves.

This type of RFI testing can ensure that onboard equipment can handle RFI stresses caused by the combination of a number of transmitting devices, such as portable and handheld transmitters, such as computers using Bluetooth and WiFi and smartphones or tablets using cellular bands, WiFi and Bluetooth communications. The frequencies of the RF transmitted using the source 10 can be similar to those expected from such devices.

Figure 5:
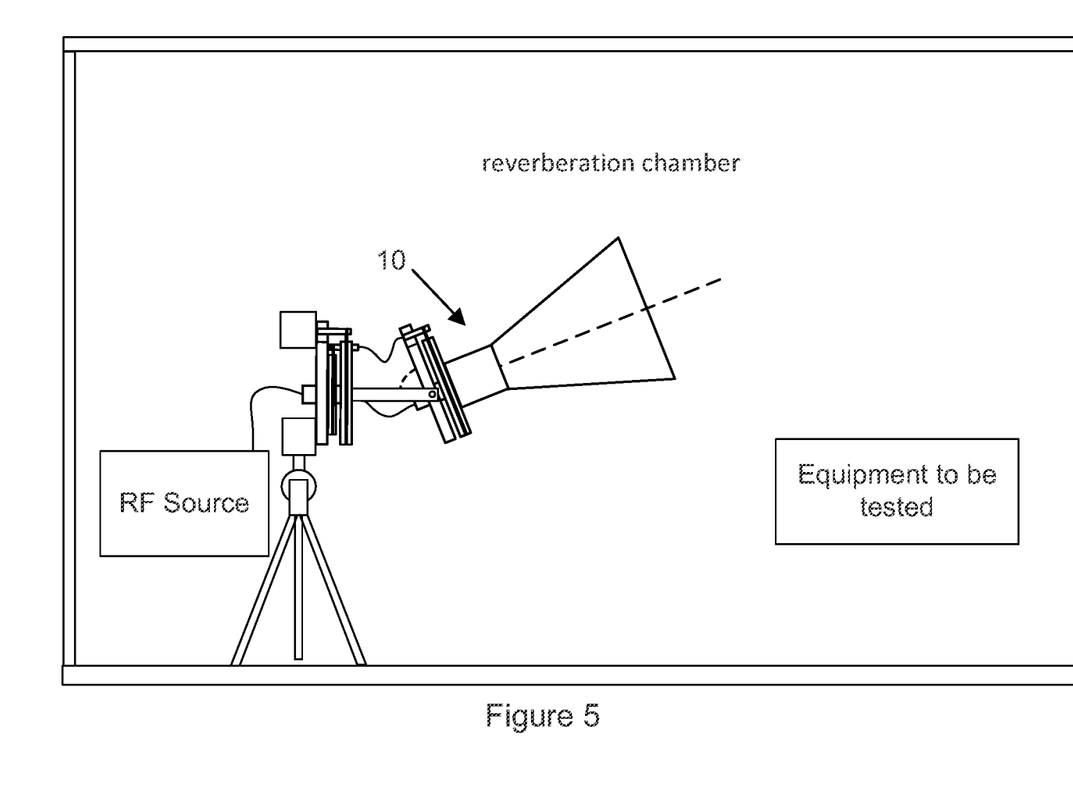
FIG. 5 is a side sectional schematic view of reverberation chamber in which the embodiment of FIG. 3 is located for illuminating the chamber with RF power for testing of electronic equipment to be tested.

In the embodiment of FIG. 5, the source 10 is used within a reverberation chamber. As is known in the art, a reverberation chamber has walls that reflect RF waves and the source 10 can be used without a stirring device to illuminate from most every direction the equipment to be tested with most every polarization by making use of the walls to reflect the RF waves.

What is claimed is:

1. A radiofrequency (RF) source for use in testing radiofrequency interference (RFI) stresses on equipment to be tested, said source comprising:
    a base;
    a first rotational joint having a first axis of rotation connected to the base and supporting a second rotational joint having a second axis of rotation at an angle with respect to said first axis;
    an RF transmitter, emitting an electromagnetic field corresponding to at least one frequency, power, and state-of-polarization (SOP), mounted to said second rotational joint for rotation about said second axis;
    a first drive for causing rotation of said first rotational joint;
    a second drive for causing rotation of said second rotational joint at a rotational speed different from said first drive;
    wherein said first drive and said second drive cooperate, in use, to emit, in a temporally continuous fashion, RF power and RF state of polarization from said RF transmitter in, respectively, a plurality of directions and different SOP orientations at each of said directions within an RF reflective structure in order to effectively characterize RFI stresses on said equipment to be tested.

2. The source as defined in claim 1, wherein said SOP orientations comprise linearly-polarized SOP orientations.

3. The source as defined in claim 1, wherein said SOP orientations comprise circular SOPs.

4. The source as defined in claim 1, further comprising an adjustment mechanism for adjusting said angle between said first rotational joint and said second rotational joint.

5. The source as defined in claim 1, wherein said base comprises an adjustable mounting having a plurality of degrees of freedom for adjusting a spatial orientation of said first rotational joint.

6. The source as defined in claim 1, wherein said first drive and said second share a common motor and have a flexible linkage interconnecting them.

7. The source as defined in claim 6, wherein said common motor is associated with said first drive, and said flexible linkage comprise a drive cable actuated by rotation of said first rotational joint.

8. The source as defined in claim 1, wherein said first drive comprises a belt or chain drive.

9. The source as defined in claim 1, wherein said second drive comprises a belt or chain drive.

10. In combination, the source as defined in claim 1 and said RF reflective structure, wherein said RF reflective structure comprises a reverberation chamber.

11. In combination, the source as defined in claim 1 and an aircraft having a fuselage for receiving said source and having said RF reflective structure for redirecting electromagnetic waves from said source to said equipment to be tested mounted within said fuselage.

12. A method of testing radiofrequency interference (RFI) stresses on equipment to be tested in an aircraft having a fuselage structure that reflects RF waves, the method comprising:
    providing a radiofrequency (RF) source as claimed in claim 1;
    positioning said source in a cabin of said fuselage;
    selecting said angle between said first rotational joint and said second rotational joint for suitable coverage of both the direction and state of polarization (SOP) of RF waves directed towards said equipment and resulting from reflections by walls of said fuselage;
    operating said first drive and said second drive while providing an RF signal to said RF transmitter of said source to cause RF waves to be propagated in a plurality of directions and different SOP orientations to effectively characterize RFI stresses on said equipment to be tested; and
    detecting any malfunction or abnormal function of said equipment under said RFI stresses.

13. The source as defined in claim 1, wherein said rotation of said first rotational joint and said rotation of said second rotational joint are continuous through many 360 degree rotations.

14. A method of testing radiofrequency interference (RFI) stresses on equipment to be tested in an aircraft having a fuselage structure that reflects RF waves, the method comprising:
    providing a radiofrequency (RF) source having a base for supporting said source, said source being support on said base by a first rotational joint having a substantially horizontal axis of rotation with said source having an angle with respect to said first rotational joint;
    positioning said source in a cabin within said fuselage structure;
    selecting said angle for suitable coverage of both the direction and state of polarization (SOP) of RF waves directed towards said equipment and resulting from reflections by walls of said fuselage;
    operating said first drive while providing an RF signal to an RF transmitter of said source to cause RF waves to be directed in a plurality of directions to reach said equipment to be tested mounted within said fuselage through said reflections by walls of said fuselage to effectively characterize RFI stresses on said equipment to be tested; and
    detecting any malfunction or abnormal function of said equipment under said RFI stresses.

15. The method of claim 14, wherein said SOP is circularly polarized.

* * * * *